United States Patent
Sànchez

(10) Patent No.: US 12,037,238 B2
(45) Date of Patent: Jul. 16, 2024

(54) LOW-HEIGHT OPTOELECTRONIC MODULES AND PACKAGES

(71) Applicant: ams Sensors Singapore Pte. Ltd., Singapore (SG)

(72) Inventor: Javier Miguel Sànchez, Eindhoven (NL)

(73) Assignee: ams Sensors Singapore Pte. Ltd., Singapore (SG)

( * ) Notice: Subject to any disclaimer, the term of this patent is extended or adjusted under 35 U.S.C. 154(b) by 717 days.

(21) Appl. No.: 17/257,214

(22) PCT Filed: Jul. 26, 2019

(86) PCT No.: PCT/SG2019/050364
§ 371 (c)(1),
(2) Date: Dec. 30, 2020

(87) PCT Pub. No.: WO2020/027724
PCT Pub. Date: Feb. 6, 2020

(65) Prior Publication Data
US 2021/0214214 A1 Jul. 15, 2021

Related U.S. Application Data

(60) Provisional application No. 62/711,698, filed on Jul. 30, 2018.

(51) Int. Cl.
*B81B 7/02* (2006.01)
*B81B 7/00* (2006.01)
(Continued)

(52) U.S. Cl.
CPC .............. *B81B 7/02* (2013.01); *B81B 7/0032* (2013.01); *B81C 1/00317* (2013.01);
(Continued)

(58) Field of Classification Search
CPC ...... B81B 7/02; B81B 7/0032; B81C 1/00317
See application file for complete search history.

(56) References Cited

U.S. PATENT DOCUMENTS

2003/0011864 A1* 1/2003 Flanders ............... B81B 3/0035
359/578
2005/0062117 A1* 3/2005 Gallup ................. G02B 6/4204
257/414
(Continued)

FOREIGN PATENT DOCUMENTS

CN 1599059 A 3/2005
CN 102200667 A 9/2011
(Continued)

OTHER PUBLICATIONS

Chinese Office Action issued for the corresponding patent application No. 201980049809.4, dated Sep. 19, 2022, 12 pages (for informational purposes only).
(Continued)

*Primary Examiner* — Errol V Fernandes
(74) *Attorney, Agent, or Firm* — Viering, Jentschura & Partner mbB; Samuel Y. Lo

(57) ABSTRACT

An optoelectronic module includes an optical filter and can have a relatively small overall height. The module includes a semiconductor die for the optical filter, where the die has a cavity in its underside. The cavity provides space to accommodate an optoelectronic device such as a light sensor or light emitter. Such an arrangement can reduce the overall height of the module, thereby facilitating its integration into a host device in which space is at a premium.

18 Claims, 3 Drawing Sheets

(51) Int. Cl.
*B81C 1/00* (2006.01)
*G02B 26/00* (2006.01)

(52) U.S. Cl.
CPC .... *B81C 1/00333* (2013.01); *B81B 2201/047* (2013.01); *B81B 2207/012* (2013.01); *G02B 26/001* (2013.01)

(56) References Cited

U.S. PATENT DOCUMENTS

| | | |
|---|---|---|
| 2009/0303487 A1 | 12/2009 | Bond et al. |
| 2014/0029085 A1 | 1/2014 | Bond et al. |
| 2015/0010031 A1 | 1/2015 | Makino et al. |
| 2016/0056194 A1 | 2/2016 | Rudmann et al. |
| 2017/0235124 A1 | 8/2017 | Kamal et al. |

FOREIGN PATENT DOCUMENTS

| | | |
|---|---|---|
| CN | 102225739 A | 10/2011 |
| CN | 104501729 A | 4/2015 |

OTHER PUBLICATIONS

Chinese First Search Report issued for the parallel Chinese patent application No. 201980049809, dated Aug. 2, 2022, 20 pages (for informational purposes only).

Dehui Xu et al: "3D monolithic integrated thermoelectric IR sensor", 2013 IEEE Sensors, IEEE, Oct. 28, 2012 (Oct. 28, 2012), pp. 1-4, XP032308659, ISSN: 1930-0395, DOI: 10.1109/ICSENS.2012.6411203.

PCT/SG2019/050364 International Search Report and Written Opinion, mailed Oct. 16, 2019, 16 pages.

Second Office Action issued for the parallel Chinese patent application No. 201980049809, dated Jan. 13, 2023, 14 pages (for informational purposes only).

First Search Report issued for the parallel Chinese patent application No. 201980049809, dated Aug. 2, 2022, 2 pages (for informational purposes only).

* cited by examiner

LOW-HEIGHT OPTOELECTRONIC MODULES AND PACKAGES

CROSS-REFERENCE TO RELATED APPLICATIONS

This application is a 371 U.S. National Phase of PCT International Patent Application No. PCT/SG2019/050364, filed on Jul. 26, 2019, which claims benefit and priority to U.S. provisional patent application No. 62/711,698 filed on Jul. 30, 2018, the disclosures of which are each incorporated by reference herein in their entirety for all purposes.

FIELD OF THE DISCLOSURE

This disclosure relates to low-height optoelectronic modules and packages.

BACKGROUND

Various consumer and other electronic devices such as smart phones incorporate optoelectronic modules that can include various optical and optoelectronic components, including optical sensors, light emitters, beam shaping elements (e.g., lenses), and/or optical filters.

A Fabry-Perot interferometer (FPI), for example, can be used as an optical filter. A FPI is based on two mirrors, whereby a Fabry-Perot cavity is formed in a gap between the mirrors. The pass band wavelength of the FPI is controlled by adjusting the distance between the mirrors, in other words, by adjusting the width of the gap.

One challenge in integrating these and other components into a smart phone or other consumer product, for example, is that space in such devices is at a premium. In particular, the height or z-profile of such devices often is designed to be relatively small, for example on the order of only a few millimeters (e.g., 2.5 mm). Such small dimensions can make it difficult to incorporate some of the optical and optoelectronic components or modules.

SUMMARY

The present disclosure describes optoelectronic modules and packages that include an optical filter and that can have a relatively small overall height. As described in greater detail below, the modules can include a semiconductor die for the optical filter, where the die has a cavity in its underside. The cavity provides space to accommodate an optoelectronic device such as a light sensor or light emitter. Such an arrangement can reduce the overall height (i.e., the z-height) of the module or package, thereby facilitating its integration into a smart phone or other device in which space is at a premium.

In one aspect, for example, a module includes an optoelectronic device mounted on a substrate, and a semiconductor die disposed over the optoelectronic device. The die includes an optical filter at a first surface facing away from the optoelectronic device. The die further has a cavity in a second surface that faces the optoelectronic device such that the optoelectronic device is accommodated within an area defined by the cavity.

In another aspect, a package includes a housing that has a lid attached to a substrate. The lid has an aperture. An optoelectronic device is disposed within the housing, is mounted on the substrate, and has an optical axis that intersects the aperture. A semiconductor die is disposed within the housing over the optoelectronic device. The die includes an optical filter at a first surface facing away from the optoelectronic device. The die has a cavity in a second surface that faces the optoelectronic device such that the optoelectronic device is accommodated within an area defined by the cavity.

Various implementations include one or more of the following features. For example, in some instances, the semiconductor die is a MEMS die, and the optical filter includes a Fabry-Perot interferometer (FPI) tunable filter. In some implementations, the MEMS die includes a silicon substrate, and the cavity is in the silicon substrate. The silicon substrate can have, for example, an <100> orientation.

The optoelectronic device can include, for example, a light sensor (e.g., a photodiode) or a light source (e.g., a laser diode or a LED).

In some cases, the module or package is integrated, for example, into a host device. For example, the host device may include a printed circuit board, and the package can be mounted to the printed circuit board. The host device may further include a processor mounted to the printed circuit board and operable for communications with one or more components if the module or package (e.g., the optoelectronic device and/or the optical filter).

In another aspect, the disclosure describes a method for manufacturing sub-assemblies, modules and/or packages. The method includes providing a first wafer on which are mounted a plurality of optoelectronic devices, and providing a second wafer having a first surface on which there is a plurality of optical filters. The second wafer has a second surface—on a side of the second wafer opposite from the first surface—in which there is a plurality of cavities. The method includes attaching the first and second wafers to one another to form a wafer stack such that each of the optoelectronic devices is accommodated in a respective one of the cavities.

Some implementations of the method include one or more of the following features. For example, in some cases, the optical filters are Fabry-Perot interferometer (FPI) tunable filters, and the method includes etching the cavities into the second surface of the second wafer.

In some cases, the second wafer comprises a silicon wafer having an <100> orientation. In such cases, the cavities can be etched, for example, using a KOH etch.

In some instances, the method includes separating the wafer stack into individual sub-assemblies each of which includes one of the FPI tunable filters disposed over one of the optoelectronic devices. The method can further include integrating one of the sub-assemblies into a packaged module.

Other aspects, features and advantages will be readily apparent from the following detailed description, the accompanying drawings and the claims.

DETAILED DESCRIPTION

The present disclosure describes optoelectronic modules and packages that include an optical filter and that can have a relatively small overall height. As described in greater detail below, the modules can include a semiconductor die for the optical filter, where the die has a cavity in its underside. The cavity provides space to accommodate a light sensor or light emitter. Such an arrangement can reduce the overall height (i.e., the z-height) of the module, thereby facilitating its integration into a smart phone or other device in which space is at a premium.

Figure 1:
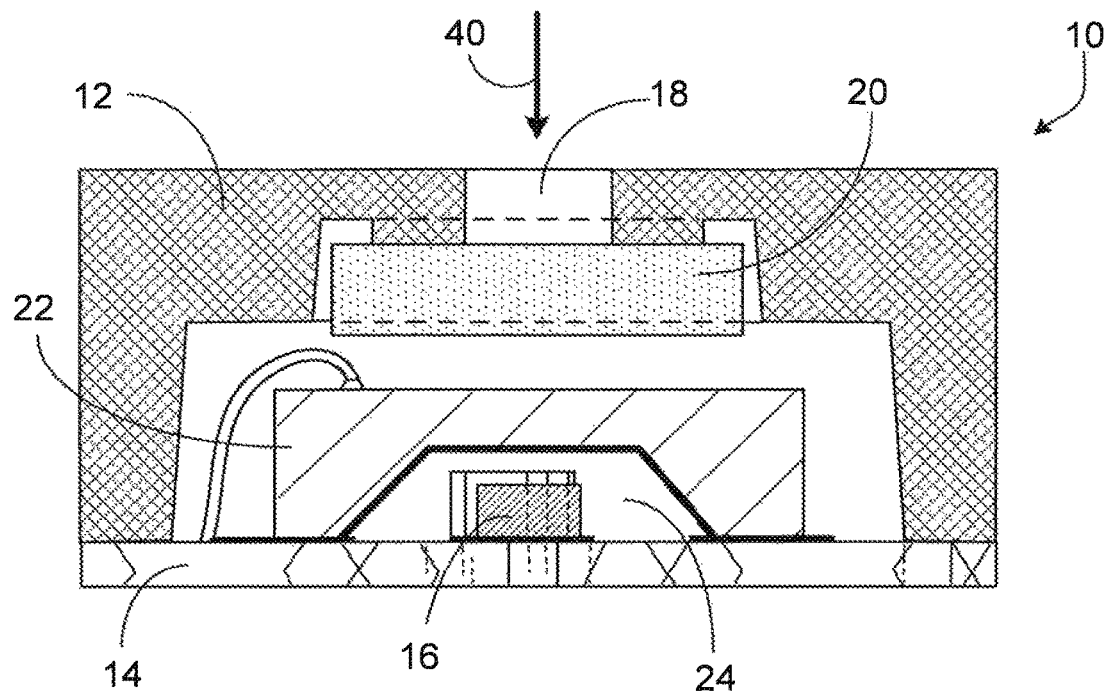
FIG. 1 is a cross-section of a first example of an optoelectronic module.

As shown in FIG. 1, an optoelectronic module 10 includes a housing that has a lid 12 attached to a printed circuit board (PCB) or other substrate 14. The lid 12 includes an aperture 18 through which light (e.g., radiation in the visible, infra-red and/or ultra-violet parts of the spectrum) can pass. In some cases, a band pass filter 20 is disposed just below the aperture 18 and serves selectively to filter the incoming light. In some instances, the thickness of the lid 12 in the vicinity of the aperture 18 is made smaller than in other regions so as to define an opening within which the filter 20 is accommodated. This arrangement can help reduce the overall height of the module 10. Making the sidewalls of the filter 20 substantially or completely inset such they are laterally surrounded by the lid 12 can help block stray light from being incident on the sides of the filter.

In the example of FIG. 1, a light sensor 16, for example a PIN or other photodiode, is mounted on the PCB 14 and has an optical axis aligned with the aperture 18 in the lid 12. One or more electrical connections (e.g., wire bonds) are provided between the sensor 16 and wiring on the PCB 14. In some instances, the sensor 16 is mounted to the PCB 14 using surface mount technology. A micromechanical (MEMS) die 22 that includes a FPI tunable filter is attached to the PCB 14 and includes a cavity 24 to accommodate the light sensor 16. Thus, an incoming light signal 40 is filtered by the band pass filter 20 and then the FPI tunable filter in the MEMS die 22 before passing to the sensor 16 as a filtered light signal.

Figure 2:
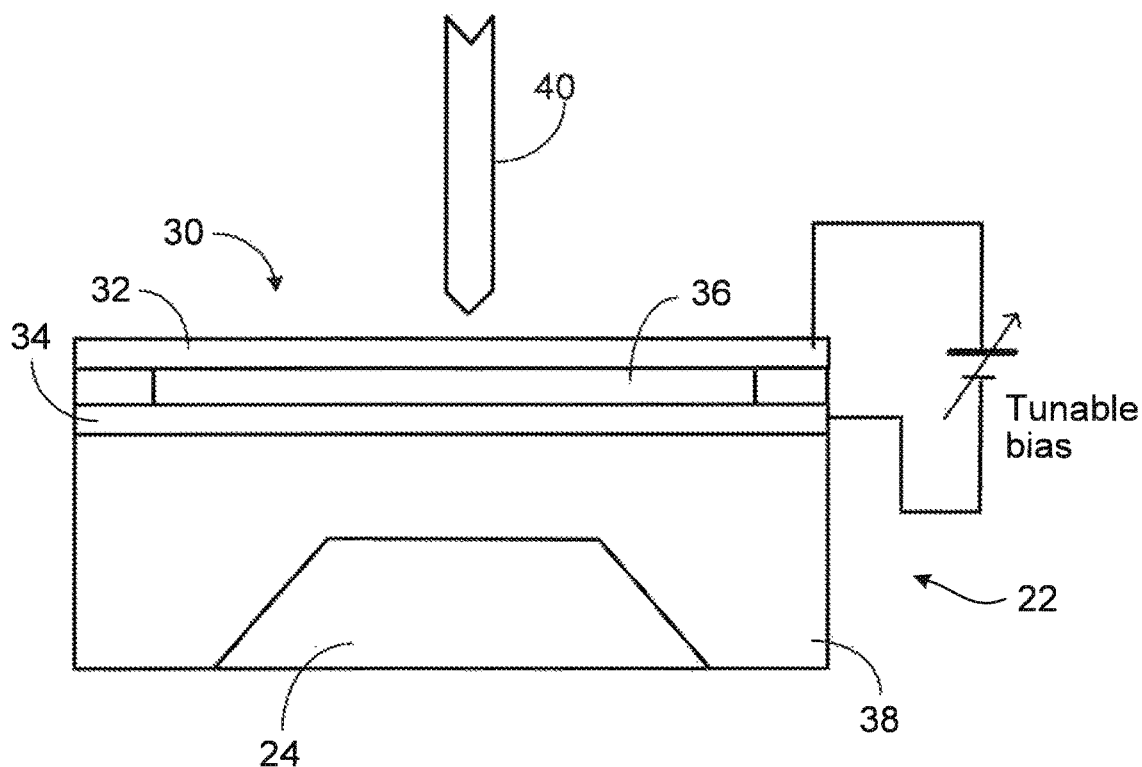
FIG. 2 illustrates an example of FPI tunable filter including a cavity in its lower surface.

FIG. 2 illustrates an example of the MEMS die 22 that includes a FPI tunable filter 30 arranged along the axis of the incoming light 40. The an incoming light signal 40 is filtered by the band pass filter 20 and then the FPI tunable filter 30 before passing to the sensor 16 as a filtered light signal. FPI tunable filter 30 has upper and lower mirrors 32, 34 that are placed opposite one another with an air gap 36 in between them. When a voltage is applied across the mirrors 32, 34, an electrostatic force is produced so as to adjust the size of the air gap 36. Adjusting the size of the air gap 36 results in a corresponding change in the filter's pass band wavelength. The mirrors 32, 34 can be formed, for example, on a silicon substrate 38 that serves to pass infra-red radiation. The mirrors 32, 34 can be implemented, for example, as multi-layer dielectric coatings (e.g., $SiO_2$, SiN or poly-Si). A moveable mirror can be obtained, for example, by removing a sacrificial layer initially formed between the mirrors 32, 34. Details of the FPI tunable filter 30 may differ in some implementations.

As illustrated in the example of FIG. 2, the cavity 24 can be formed in the substrate 38 of the MEMS die 22. The height of the cavity 24 should be sufficiently large that it also can accommodate, in addition to the sensor 16, any required wire bonds or other electrical connections. On the other hand, preferably, the dimensions of the cavity 24 should not be so large as to impact the rigidity of the substrate adversely.

In some instances, the cavity 24 can be shaped to provide a beam-shaping function. For example, a Fresnel or other lens can be integrated into the cavity 24 to help focus the incoming light onto the light sensitive region(s) of the sensor 16. In general, the beam shaping function of the cavity, if any, should be relatively achromatic, so as to be applicable for all wavelengths in the spectral sensor/emitter range.

Figure 3:
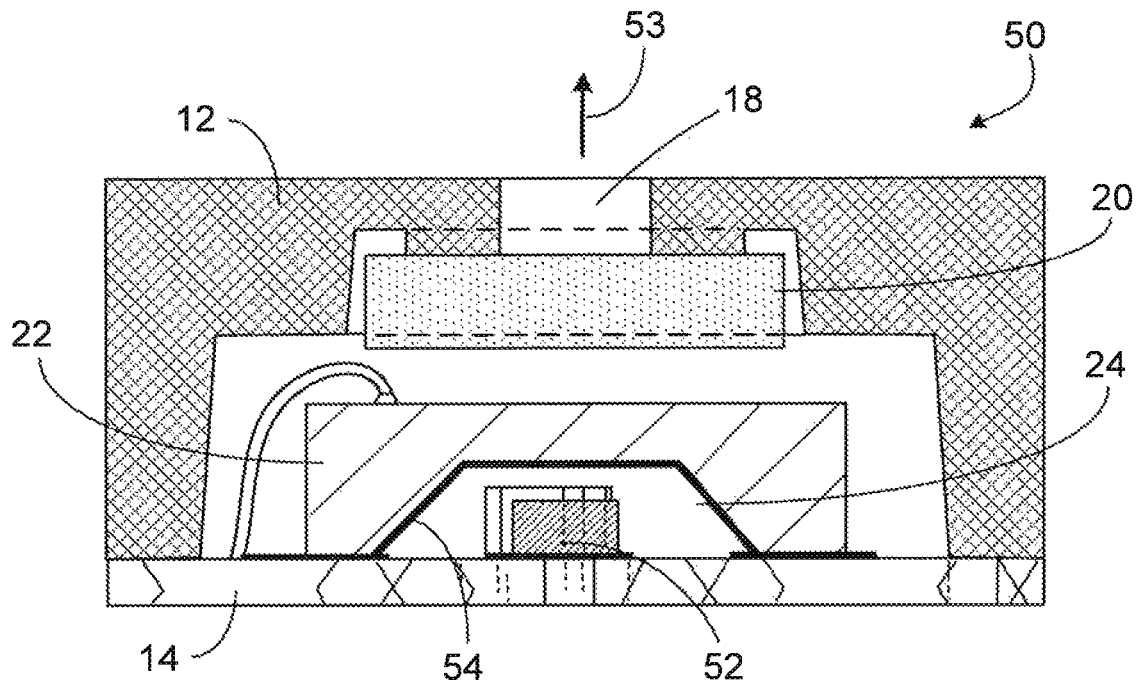
FIG. 3 is a cross-section of a second example of an optoelectronic module.

Although the foregoing example illustrates an example of a MEMS-FPI tunable filter 30 and a light sensor 16 in a single package, other implementations can include a MEMS-FPI tunable filter and a light source in a single package. An example is illustrated in FIG. 3, in which components that are the same as those in FIG. 1 are labeled with the same reference numbers. Instead of a light sensor, the optoelectronic module 50 of FIG. 3 includes a light source 52 such as a light emitter (e.g., a laser diode or LED). Light produced by the source 52 is filtered by the MEMS-FPI tunable filter in the MEMS die 22 and then is filtered by the band pass filter 20 before exiting the package through the aperture 18 as light signal 53.

Figure 4:
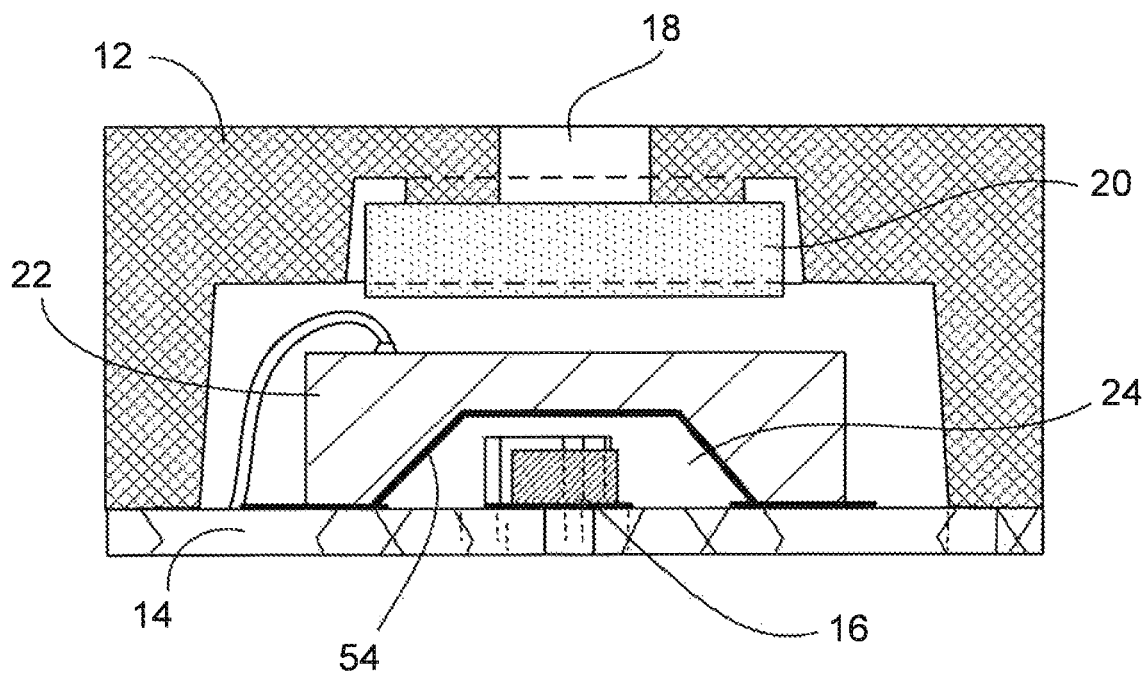
FIG. 4 is a cross-section of a third example of an optoelectronic module.

In some implementations, the surface of the cavity 24 includes an anti-reflection coating 54, as shown in FIG. 3. Such an anti-reflection coating also can be incorporated into light sensor modules as shown in the example of FIG. 4.

By accommodating the optoelectronic component (e.g., light sensor 16 or light emitter 52) within the cavity 24 on the underside of the MEMS die 22, the z-height of the MEMS sub-assembly, as well as the z-height of the overall module, can be reduced. For example, separate spacers to support the MEMS die over the optoelectronic component are not needed. Thus, the number of processing steps and the number of components also can be reduced. Further, as described below, the MEMS sub-assembly can be fabricated as part of a wafer-level process.

Figure 5A:
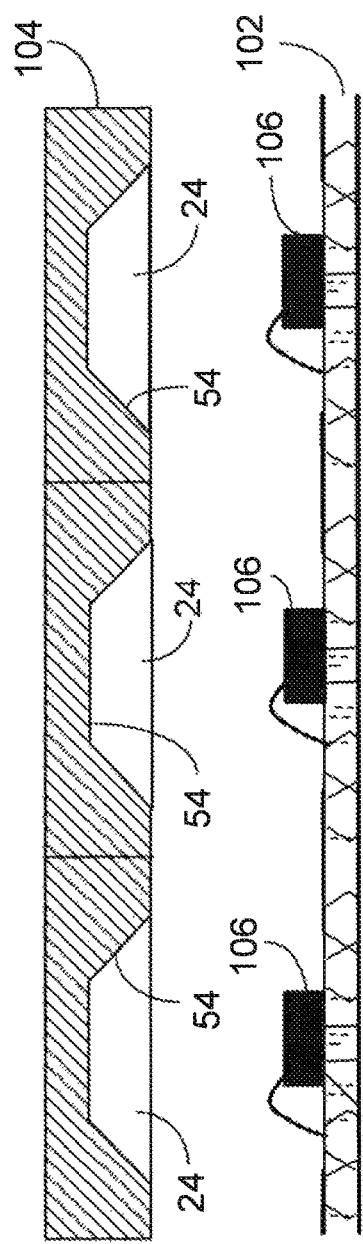
FIGS. 5A-5C illustrate stages in the fabrication of sub-assemblies for the modules.
Figure 5B:
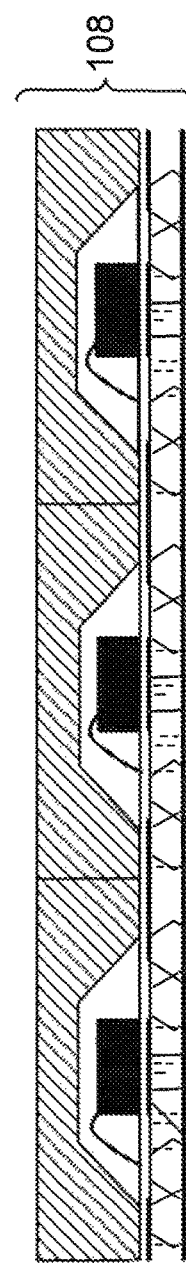
Figure 5C:
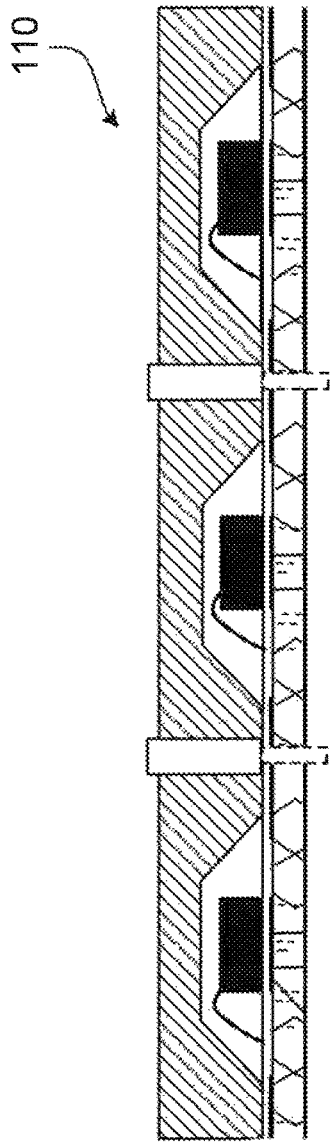

FIGS. 5A-5C illustrate an example of a wafer-level process for fabricating the MEMS sub-assemblies (i.e., a sub-assembly including a MEMS die 22 and an optoelectronic device 16 or 52 mounted on a PCB substrate 14). As shown in FIG. 5A, a first wafer 102 has multiple optoelectronic devices 106 (e.g., light sensors or light sources) mounted on its surface. The first wafer 102 can be, for example, a printed circuit board. Multiple FPI tunable filters are formed on a second wafer 104, composed for example of a <100> oriented silicon wafer. The FPI tunable filters on the MEMS wafer 104 are spaced from one another so that, when the two wafers 102, 104 subsequently are attached to one another, each FPI tunable filter will be aligned over a corresponding one of the optoelectronic devices 106 (see FIG. 5B).

The second wafer 104 includes cavities 24 that can be formed, for example, by performing an anisotropic wet etch (e.g., KOH) in the backside of the silicon <100> oriented wafer so as to leave the {111} planes exposed. Formation of the cavities 24 can be performed at any appropriate stage in the MEMS process.

As a particular example, it can be assumed that the MEMS wafer 104 has a thickness of about 625 um, the photodiode die (e.g., an InGaAs photodiode) has a height of about 200 um, and the adhesive used to attach the photodiode die to the PCB wafer 102 has a thickness of about 10 um. Assuming further that the backside of the MEMS wafer 104 is etched to form a cavity having a depth (height) of about 310 um, a height of about 100 um would be available for a shallow wire bond from the top of the photodiode die to the PCB wafer 102. The remaining thickness of the MEMS wafer 103 (i.e., about 315 um in this example) would hold the MEMS structure on its upper surface. Different dimensions may be appropriate for other implementations.

In some instances, it may be desirable or necessary to cover the front side of the wafer 104 with a protective coating during the anisotropic wet etch. Other techniques can be used to form the cavities as well.

In some implementations, an anti-reflection coating 54 is applied to the inner surfaces of the cavities 24. The anti-reflection coating 54 can help provide better optical transmission at the silicon-to-air interface.

Following formation of the cavities 24, the two wafers 102, 104 are aligned and attached to one another, for example, by adhesive to form, a wafer stack 108 (FIG. 5B), and then the wafer stack 108 is separated (e.g., by dicing) into singulated sub-assemblies 110 (FIG. 5C). A respective lid 12 then can be disposed over each sub-assembly to complete the modules. In some instances, prior to dicing, the stack 108 is disposed on a carrier wafer or dicing tape.

Various advantages can be obtained in some implementations. For example, wafer-level integration of the optoelectronic device (e.g., light sensor or light source) and the MEMS die can be done monolithically, allowing for a significant z-height reduction. In some cases, the manufacturing process can require fewer steps, thus resulting in less time-consuming and less costly processes. In some instances, the enclosure for the optoelectronic device (e.g., the light sensor) is improved and results in less stray light reaching the light sensor. In addition to facilitating wafer-level processing, the techniques described here can provide a very well-controlled photodiode-MEMS gap using the silicon etching process.

The foregoing modules can be used in a range of applications, including for spectral sensing, spectroscopy or infra-red sensing. For example, the modules can used for low-height spectroscopy sensors or tunable light sources, which can be integrated into a range of consumer or other products. The modules described here can be mounted, for example, on a printed circuit board that is a constituent of a host device such as a hand-held communications or computing device (e.g., a mobile phone, smart phone, tablet, personal digital assistant (PDA) or laptop). In some cases, the modules may be integrated into small electronic devices, such as bio devices, mobile robots, surveillance cameras, camcorders, laptop computers, and tablet computers, among others.

As a particular example, the modules described above can be integrated into, and interconnected to other components in, a host device, which may include a processor, memory, an input/output device (including an interactive display), a communications interface, and/or a transceiver. The various components can be interconnected using various buses, and several of the components may be mounted on a common motherboard. Connections can be provided between the module and the processor for communicating signals between the module and processor (e.g., signals to control a voltage applied to the tunable sensor, signals to control emission of light from the light source, and/or signals from the light sensor). The module also can be interconnected to other components in the host device and, in some implementations, can be mounted on the common motherboard with some of the other components.

In some implementations, the modules can be used for one or more of the following applications: material identification, humidity detection (e.g., skin, tissues), food analysis, thickness measurements, soil analysis, identification of counterfeit objects, milk analysis, or product adulteration and safety detection.

The modules of FIGS. 1 and 3, for example, can be used in a measurement mode in which a light source (e.g., a white light source) illuminates a sample. The light source may be integrated into the same module as the sensor, or may be separate from the module containing the sensor. Transmission light intensity at a particular wavelength can be measured selectively by tuning the FPI filter in the MEMS die 22 to the desired wavelength.

Integrating a module as described above (e.g., the modules of FIG. 1, 3 or 4) into a host device can be advantageous. For example, the host device can include powerful processors with associated memory that can be used to process data collected by the module. Further, the data can be augmented by additional data collected by other components integrated into the host device. For example, in some instances, an image collected by the host device can be analyzed and augmented with data collected by the module for material identification. Further, the present disclosure facilitates integration of the modules into host devices while maintaining the small z-height of the host devices.

Other implementations are within the scope of the claims.

What is claimed is:

1. A module comprising:
   an optoelectronic device mounted on a substrate; and
   a semiconductor die disposed over the optoelectronic device, the die including an optical filter at a first surface facing away from the optoelectronic device, the die further having a cavity in a second surface that faces the optoelectronic device such that the optoelectronic device is accommodated within an area defined by the cavity,
   wherein the semiconductor die is a MEMS die that includes a silicon substrate, the cavity being in the silicone substrate.

2. The module of claim 1 wherein the optical filter includes a Fabry-Perot interferometer (FPI) tunable filter.

3. The module of claim 1 wherein the silicon substrate has an (100) orientation.

4. The module of claim 1 wherein the optoelectronic device comprises a light sensor.

5. The module of claim 1 wherein the optoelectronic device comprises a light source.

6. The module of claim 1 including an anti-reflection coating on an inner surface of the cavity.

7. A package comprising:
   a housing including a lid attached to a substrate, the lid having an aperture therein;
   an optoelectronic device within the housing, the optoelectronic device being mounted on the substrate and having an optical axis that intersects the aperture; and
   a semiconductor die within the housing, the semiconductor die being disposed over the optoelectronic device, the die including an optical filter at a first surface facing away from the optoelectronic device, the die further having a cavity in a second surface that faces the optoelectronic device such that the optoelectronic device is accommodated within an area defined by the cavity.

8. An apparatus comprising:
   a host device including a printed circuit board; and
   the package of claim 7 mounted to the printed circuit board.

9. The apparatus of claim 8 further including a processor mounted to the printed circuit board and operable for communications with at least one of the optoelectronic device or the optical filter.

10. A method comprising:
providing a first wafer on which are mounted a plurality of optoelectronic devices;
providing a second wafer having a first surface on which there is a plurality of optical filters, the second wafer having a second surface in which there is a plurality of cavities, the second surface being on a side of the second wafer opposite from the first surface; and
attaching the first and second wafers to one another to form a wafer stack such that each of the optoelectronic devices is accommodated in a respective one of the cavities.

11. The method of claim 10 wherein the optical filters are Fabry-Perot interferometer (FPI) tunable filters, the method further including etching the cavities into the second surface of the second wafer.

12. The method of claim 11 further including separating the wafer stack into individual sub-assemblies each of which includes one of the FPI tunable filters disposed over one of the optoelectronic devices.

13. The method of claim 12 further including integrating one of the sub-assemblies into a packaged module.

14. The method of claim 10 wherein the second wafer comprises a silicon wafer.

15. The method of claim 14 wherein the second wafer comprises a silicon wafer having an (100) orientation.

16. The method of claim 14 including etching the cavities using a KOH etch.

17. The method of claim 10 wherein the first wafer is a printed circuit board wafer.

18. The method of claim 10 including applying an anti-reflection coating on inner surfaces of the cavities.

* * * * *